United States Patent
Ramm et al.

(10) Patent No.: US 9,416,438 B2
(45) Date of Patent: Aug. 16, 2016

(54) METHOD FOR PRODUCING COATINGS WITH A SINGLE COMPOSITE TARGET

(75) Inventors: Jürgen Ramm, Maienfeld (CH); Beno Widrig, Bad Ragaz (CH); Helmut Rudigier, Bad Ragaz (CH)

(73) Assignee: OERLIKON SURFACE SOLUTIONS AG, PFAFFIKON, Pfaffikon SZ (CH)

( * ) Notice: Subject to any disclaimer, the term of this patent is extended or adjusted under 35 U.S.C. 154(b) by 0 days.

(21) Appl. No.: 13/386,093

(22) PCT Filed: Jul. 16, 2010

(86) PCT No.: PCT/EP2010/004365
§ 371 (c)(1),
(2), (4) Date: Mar. 14, 2012

(87) PCT Pub. No.: WO2011/009573
PCT Pub. Date: Jan. 27, 2011

(65) Prior Publication Data
US 2012/0160665 A1    Jun. 28, 2012

Related U.S. Application Data

(60) Provisional application No. 61/227,452, filed on Jul. 22, 2009.

(51) Int. Cl.
*C23C 14/00* (2006.01)
*C23C 14/32* (2006.01)
*C23C 14/06* (2006.01)

(52) U.S. Cl.
CPC ........... *C23C 14/325* (2013.01); *C23C 14/0084* (2013.01); *C23C 14/06* (2013.01)

(58) Field of Classification Search
CPC ..... C23C 14/325; C23C 14/06; C23C 14/617; C23C 14/0021
See application file for complete search history.

(56) References Cited

U.S. PATENT DOCUMENTS 5,298,136 A * 3/1994 Ramalingam ..... H01J 37/32055
 204/192.38
5,993,904 A * 11/1999 Boucher .................... 427/248.1
(Continued)

FOREIGN PATENT DOCUMENTS

CN     101263575 A    9/2008
DE      19902146 A1   8/2000
(Continued)

OTHER PUBLICATIONS

Ramm, et al., "Thermal Stability of Thin Film Corundum-Type Solid Solutions of (Al 1–x Cr x) 2O3 Synthesized Under Low-Temperature Non-Equilibrium Conditions", Advanced Engineering Materials, 2007, 9, No. 7.
(Continued)

*Primary Examiner* — Keith Hendricks
*Assistant Examiner* — Timon Wanga
(74) *Attorney, Agent, or Firm* — Pearne & Gordon LLP

(57) ABSTRACT

The invention pertains to a method for the production of coatings by physical vapor deposition (PVD), wherein a binary target or a target with more than two constituents is evaporated in a curvilinear cathodic arc discharge, causing the ions with different masses (elements) to be splitted and the ion splitting results in variations for the ratio of the different masses (elements) at different positions in the deposition chamber.

16 Claims, 8 Drawing Sheets

(56) References Cited

U.S. PATENT DOCUMENTS

| | | | |
|---|---|---|---|
| 6,137,112 A * | 10/2000 | McIntyre et al. | 250/492.21 |
| 2002/0102398 A1* | 8/2002 | Shi et al. | 428/334 |
| 2004/0168637 A1* | 9/2004 | Gorokhovsky | 118/723 ER |
| 2007/0285839 A1* | 12/2007 | Suzuki et al. | 360/131 |
| 2010/0215975 A1* | 8/2010 | Yamamoto | C23C 14/0021 428/469 |

FOREIGN PATENT DOCUMENTS

| WO | 2006/099754 A1 | 9/2006 |
|---|---|---|
| WO | 2006/099758 A2 | 9/2006 |
| WO | 2006/099760 A1 | 9/2006 |
| WO | 2008/009619 A1 | 1/2008 |
| WO | 2008/043606 A1 | 4/2008 |

OTHER PUBLICATIONS

Zverev, et al., "The Current Column Contraction and Ion Charge Increase Induced by the Current Build-Up in a Pulsed Vacuum Discharge", Irkutsk State University, Irkutsk, Russia, Jun. 3, 1999.

Stoney, "The Tension of Metallic Films Deposited by Electrolysis", 'Nature', Aug. 20, 1908, pp. 172-175.

Anders, et al., "Cathodic Arcs", Energetic Condensation and Subplantation, From Fractal Spots to Energetic Condensation.

Durand-Drouhin, et al., "Mechanical Properties and Failure modes of TiAl(Si)N Single and Multilayer Thin Films", Surface & Coatings Technology, 2003.

Ramm, et al., "Pulse Enhanced Electron Emission (P3eTM) Arc Evaporation and the Synthesis of Wear Resistant Al—Cr—O Coatings in Corundum Structure", Surface & Coatings Technology, OC Oerlikon Balzers AG, 2007.

Fuchs et al., "Distribution of Ion Current Density in a Modified Pulse Arc Process as a Function of Pulse Parameters", Surface and Coatings Technology, 1998.

Anders, "Ion Charge State Distributions of Pulsed Vacuum Arcs-Interpretation of Their Temporal Development", IEEE Transactions on Plasma Science, vol. 26, No. 1, Feb. 1998.

Freund, et al., "Thin Film Materials—Stress, Defect Formation and Surface Evolution", Cambridge University Press, 2003.

Doolittle, "A Semiautomatic Algorithm for Rutherford Backscattering Analysis", Nuclear Instruments and Methods in Physics Research, 1986, pp. 227-231.

Anders, et al., "Time Dependence of Vacuum Arc Parameters", Transactions on Plasma Science, vol. 21, No. 3, Jun. 1993.

Written Opinion for PCT/EP2010/004365 dated Oct. 14, 2010.

Response to Written Opinion for PCT/EP2010/004365 dated May 4, 2011.

\* cited by examiner

Table 1: Process parameter of the samples

|  | Sample A | Sample B | Sample C | Sample D |
|---|---|---|---|---|
| Target | AlCr (70:30) | AlCr (70:30) | AlCr (70:30) | AlCr (70:30) |
| Substrate bias [V] | -60 | -60 | -60 | -60 |
| Substrate temperature [°C] | 550 | 550 | 550 | 550 |
| Oxygen flow [sccm] | 400 | 400 | 600 | 600 |
| Average arc current [A] | 200 | 200 | 200 | 200 |
| Arc current parameter | DC | Base: 50 A Pulse: 420 A $10^6$ A/s | DC | Base: 50 A Pulse: 420 A $10^6$ A/s |

METHOD FOR PRODUCING COATINGS WITH A SINGLE COMPOSITE TARGET

The invention is related to a method to generate and control the intrinsic stress of thin layers deposited by PVD, especially by cathodic arc evaporation.

RELATED ART

Cathodic arc evaporation is the dominant PVD technology to produce wear resistant coatings for cutting tools. One reason for this is the robustness and the low running costs of this technology in comparison with sputtering and hollow cathode evaporation. Another reason is the simplicity to produce, in addition to pure metallic layers, binary and ternary nitrides and carbo-nitrides in reactive processes which do not require a sophisticated control of the reactive gas flow like it is the case for sputtering and evaporation. This process feature is especially important for batch-type processing in production environment with its varying loads and the limited control over degassing of the different substrate types due to the fabrication steps before the PVD arc deposition.

Recently, the arc technology was extended to the formation of oxides in the P3e™ production approach (J. Ramm, M. Ante, T. Bachmann, B. Widrig, H. Brändle, M. Döbeli, Surf. Coat. Technol. 202 (2007) 876, WO 2006/099758, WO 2006/099760, WO 2008/009619). The main advantage of this new technology is the possibility to reduce the substrate temperature to about 500° C., but still forming high temperature crystalline corundum-type structures under this condition (J. Ramm, M. Ante, H. Brändle, A. Neels, A. Dommann, M. Döbeli, Advanced Engineering Materials 9 (2007) 604). This advantage is two-fold. On the one hand, substrate materials can be coated which cannot resist the high process temperatures in CVD processing for oxide formation, e.g. high speed steel. On the other hand, the extrinsic stress due to the thermal mismatch between the oxide layer and the substrate is reduced.

One issue of special importance for applications of these PVD oxides for cutting tools is the control of the intrinsic stress in the layer. In contrast to PVD nitride layers, oxides usually exhibit small and mostly tensile stress if the layers are deposited in pure oxygen atmosphere and at moderate substrate bias voltages (between −60 C and 0 V). This is a disadvantage in some cutting tool applications because tensile stress cannot resist the crack propagation as easily as it known from experience for the PVD nitrides which exhibit usually large compressive stress (−2 to −6 GPa). The experience proves that especially in interrupted cutting operations coatings exhibiting compressive stress have advantages. Therefore, a method to influence the intrinsic stress is of great practical interest.

It is known that the ion current drawn over the substrate by an applied negative substrate voltage (so called substrate bias) plays an essential role in the generation and optimization of the intrinsic layer stress (A. Anders, Cathodic Arcs, Springer, 2008, pp. 376, p. 439). Unfortunately it was found that arc evaporation in pure oxygen reactive gas reduces for similar process conditions the ion substrate current significantly, not only in comparison with the evaporation of metals in argon gas, but also in comparison with the operation of the arc sources in nitrogen atmosphere. This is an effect which could be due to "target poisoning" (A. Anders, Cathodic Arcs, Springer, 2008, pp. 414) or other chemical processes in the plasma or at the substrate surface. The addition of argon to the oxygen gas and higher (more negative) bias have the potential to influence the intrinsic stress. However they may result in disadvantages like increased (and preferential) sputtering of the substrate surface and create layer instabilities due to the incorporation of argon in the layer.

DISADVANTAGES OF THE STATE OF THE ART

The state of the art for the synthesis of oxides (and the original motivation for the development) produced by arc evaporation is characterised by the following drawbacks:
1. The oxide layers exhibit low and usually tensile stresses. If it is applied to a cutting tool, the coating cannot prevent crack propagation for some applications, especially if the coated tool is utilized in some interrupted cutting processes.
2. A possible method to induce compressive stress in the layers could be the utilization of higher (more negative) substrate bias. However, the substrate ion current in the arc deposition processes utilizing oxygen as reactive gas is very low compared to processes for the deposition of metals, metal nitrides and metal carbo-nitrides.
3. The addition of argon to the oxygen did not increase the substrate ion current and is therefore not suitable for designing specific layer stress.
4. Experiments showed that the reduction of the oxygen reactive gas pressure to the minimum value necessary to achieve stoichiometric oxides at the substrate surface will also increase the substrate ion current. However, the operation at reduced oxygen pressure will also increase the evaporation rate. Balancing of both effects needs a more sophisticated process control.

Besides the aspects mentioned above, there is a need for additional strategies to generate and control the intrinsic stress in oxide coatings with the goal for increasing hardness and fracture toughness of the oxides, i.e. finding possibilities of altering the basic properties of the oxide material.

OBJECTIVES OF THE INVENTION

It is the objective of the present invention to provide a method for producing improved coatings on substrates. Improvement for example related to mechanical, optical and or electronical properties.

SUMMARY OF THE INVENTION

The present invention is based on investigations which were conducted with the goal to find methods of influencing the intrinsic layer stress. The results shown were obtained from the experiments in which $(Al_{1-x}Cr_x)_2O_3$ layers were synthesized utilizing Al—Cr composite targets for the arc evaporation. However, it will become clear to the experts that the results are valid also for other ternary (and higher) oxides based on depositions utilizing composite targets and can also be applied for ternary (and higher) nitrides. Because ternary oxides are quite new materials produced by arc evaporation (WO 2006/099754, WO 2008/043606) and therefore not yet investigated in all details, the search for possibilities to generate, control and influence the intrinsic stress in these materials and to gain basic knowledge to optimize the performance of these materials for cutting tools is of interest.

Therefore, it was the intention to investigate the pulsed operation of the arc sources (like it is described in previous patent applications of the same inventor (WO 2006/099758, WO 2006/099760) and it's effects on the substrate ion current as one strategy to balance the drop in substrate ion current and to gain a useful process parameter for influencing the intrinsic layer stress.

Surprisingly, in addition to this another new method was found during these investigations which could be used also to influence the intrinsic layer stress. This method is based on the formation of multi-layer coatings in a simple and cost-effective method.

Based on this method, layers can be synthesized which exhibit unique structures and for which the intrinsic stress can be engineered also under production conditions.

Besides altering mechanical layer properties, this method has also the potential to alter electrical and optical properties in ternary and higher compounds, especially in oxides.

The method is based on the utilization of binary (or with more than 2 constituents) targets which are utilized as cathode in a DC or pulsed curvilinear arc discharge. Curvilinear in this context means asymmetric with respect to an axis normal to the target surface. As the inventors found, such a curvilinear arc discharge leads to a partial separation of the ions of different metals. This partial separation of the metal ions results in a higher concentration of ions of a first metal in a first area and higher concentration of ions of a second metal in a second area of the coating chamber. When substrates to be coated are passing the first area and subsequently passing the second area, the deposited layer shows different concentrations of the metals. It should be noted that such a concentration change may be reached as well with non moving substrates if the asymmetry of the arc discharge is switched.

The inventors where not able to prove what causes the ion splitting in the context of such an asymmetric arc discharge. However, as a working hypothesis it can be assumed that the arc curvilinearity which can easily guide the electrons to the anode will not guide the ions with the much higher mass and inertness as well. As the ions tend to leave the discharge in a straight way, the charge separation may cause electric forces which bend the ions back to the discharge. For different ion masses and charge states, this back bending results in ion splitting.

One possibility to improve coatings is to manipulate (increase and/or decrease) intrinsic stress of the coating. According to the present invention new methods of oxide (but not restricted to oxides only) layer synthesis are demonstrated which can be utilized to control and increase/decrease the intrinsic stress.

According to the inventive method the compressive stress may be increased, especially in oxides, based on the utilization of preferably a single composite target for the arc evaporation.

The inventive method may be used in production systems comprising rotating as well as non-rotating substrates.

According to the present invention intrinsic stress may be generated and controlled in binary and higher compounds based on the formation of multi-layered structures which originate from stoichiometric variations of the target constituents in the layer as a function of coating depth. In addition variations in lattice parameters or even in the crystal structure of the crystal may be introduced in the multilayer. These multi-layer structures can be controlled also in production systems down to the nanometer scale of the bilayer.

With the inventive method generation of strain in these multi-layer structures by strained-layer epitaxial growth is possible. This allows the specific influence on the mechanical properties of the layer. It is also the base for influencing electrical and optical properties of the layer material based on the mechanical strain generation.

These methods are based on the utilization of targets comprising more than one constituent, i.e. binary, ternary or targets with more constituents. Although this method can be utilized for metals, nitrides, carbo-nitrides and other compounds, especially applications for oxides are described here. Although cathodic arc evaporation is the preferred method to generate these layers, the method can be also used in sputtering and high power pulsed sputtering provided that high enough discharge currents can be generated and high enough ionization of the vaporized target material can be achieved in the curvilinear discharge current.

DETAILED DESCRIPTION OF THE INVENTION

Figure 1A:
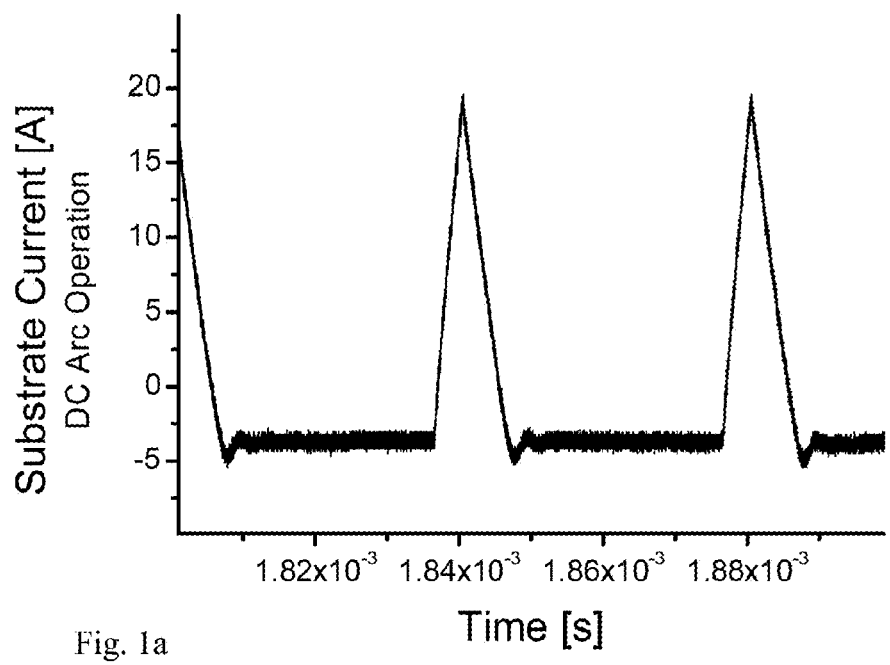
FIG. 1a shows a substrate current obtained for the DC operation of the cathodic arc source with 200 A and the substrate bias of −60 V utilizing one Al—Cr target. The bipolar bias of 25 kHz has a negative pulse length of 36 µs and a positive pulse length of 4 µs.

The invention is based on experiments which were performed in an Innova production system of OC Oerlikon Balzers AG. For the experiments, the system was modified with respect to arc power supplies. The samples selected for analysis were prepared with three arc sources only. Two of them were equipped with a Cr target for the deposition of the interface. Only one Al—Cr composite target with a nominal composition of 70 at % Al and 30 at % Cr was used for the third source to synthesize the Al—Cr—O functional oxide layer. The target was mounted close to the chamber wall. The substrates were fixed to a substrate holder which was a substrate tree rotating about its stock. The substrate tree was mounted to the periphery of a rotating table with a vertical rotational axis.

The substrate tree rotated with a velocity of 7 cycles per minute. Convenient is a rotation velocity between 5 cycles per minute and 90 cycles per minute. The rotating table rotated with a velocity of 1.6 cycles per minute. Convenient is a rotation between 1 cycle per minute and 30 cycles per minute. As a rule of thumb, the substrate tree should rotate at least 3 times faster than the table. Preferably the substrate tree rotates at least 5 times faster than the table. Most preferably the substrate tree rotates at least 10 times faster than the table.

The target and the substrates were positioned at the same height. The substrates (polished cemented carbide inserts and/or pieces of silicon wafers which were (001)-oriented) were wet chemical cleaned before deposition. After evacuation of the process chamber to a pressure below 10-5 mbar, standard heating to 500° C. and argon ion etching were performed to ensure a good layer adhesion to the substrate.

An adhesion layer of about 150 nm Cr was deposited first. The arc sources were operated in pure argon gas during this process step. In the next step the evaporation of the Al—Cr composite target was initiated and oxygen controlled by a gas flow meter was added to the chamber. Simultaneously, the argon flow was ramped down and the two Cr sources were switched off after a few minutes. The deposition of the substrates with the Al—Cr—O functional layer was performed in pure oxygen atmosphere and with constant oxygen flow. The arc sources were operated either with DC current (sample A and C) or with pulsed current (sample B and D). An arc current of 200 A was chosen for the DC mode. In the pulsed mode, a continuous base current of 50 A was superposed with current pulses. The principal of the pulsed operation of the arc sources in oxygen reactive gas was already described in the previous patent applications of the inventor (WO 2006/099758) in greater detail. A single commercial available power supply was used in the experiments here which could be operated in DC as well as in the pulsed mode. The pulse width, the pulse height and the frequency of the pulses were chosen in a way that the time average of the pulsed arc current was 200 A as well. For all depositions, a substrate temperature of 550° C. and a substrate bias of −60 V were chosen. This (low) bias value has only little influence on stress formation in the layer. It was selected to reduce overlapping effects with other origins of stress in the coatings. The bias value was also kept constant for all depositions. It is known by the experts in this field that the increased (more negative) substrate bias will tend to increase the energy of condensation of the ions and generate compressive layer stress (A. Anders, Cathodic Arcs, Springer, 2008, pp. 365). It was, however, not the objective of this work to find or prove the functional dependency also for oxides deposited by cathodic arc evaporation, but to find additional principals of generation and influencing the layer stress. The bipolar bias voltage in the experiments had a frequency of 25 kHz with a length for the negative pulse of 36 μs and 4 us for the length of the positive pulse. These parameters have been shown to allow a reliable deposition process for the synthesis of oxides and avoid the generation of arcs at the substrate surface. The value of the bias results in a moderate ion bombardment during the whole pulsed arc current sequence, however, at energies which make sputtering of the substrate surface in pure oxygen atmosphere very unlikely. The main deposition parameters are summarized in Table 1.

The origin of the intrinsic stress is multifaceted (L. B. Freund and S. Suresh, Thin Film Materials, Cambridge, 2003, pp. 60). As already indicated, the substrate ion current is an important process parameter to influence the stress. It is utilized to control the dissipated energy at substrate site, influence the condensation process and therefore also the growth and the material properties of the deposited coating. The main objective of the investigations was therefore the search for methods to compensate the remarkable drop in the substrate ion current during arc evaporation in oxygen atmosphere and to find additional methods to generate and control the layer stress.

During the investigations a new method of forming multi-layer structures in a surprisingly simple way was invented. This method allows the growth of strained layers and therefore the altering of the intrinsic stress by the alteration of the strain energy in the layer.

The following comprises a description of the experiments which show the basis of the invention.

The measurements of the substrate ion current were performed during layer deposition with an oscilloscope. In the example only one substrate-tree out of ten was left in the chamber at which the substrates were mounted. This means that the substrates experienced two-fold rotation during deposition: the rotation of the substrate table (2) and the rotation of the substrate-tree (4) placed at the circumference of the substrate table (see FIG. 5).

In addition to the measurements of the substrate current, the deposited layers were analyzed by the following methods:

The morphology of the layers was investigated by cross-section scanning electron microscopy (X-SEM) in a LEO 1530 scanning electron microscope.

The layer composition of the oxide coatings synthesized has been analyzed by Rutherford Backscattering Spectrometry (RBS) (W. K. Chu, J. W. Mayer, M. A. Nicolet in: Backscattering Spectrometry, Academic Press, 1978). The measurements have been performed using a 2 MeV, 4He beam and a silicon surface barrier detector under 165°. The collected data have been evaluated using the RUMP program (L. R. Doolittle, Nucl. Instr. and Meth. B15 (1986) 227). Under these conditions, this method allows an analysis of the top layer down to a depth of about 500 nm. Transmission electron microscopy (TEM) on cross sections of the layers was utilized to investigate the layer morphology by bright- and dark field imaging, the crystal structure by selected area electron diffraction (SAED) and the layer composition with high spatial resolution energy dispersive X-ray spectroscopy (EDXS) combined with scanning transmission electron microscopy (STEM). The cross sections were prepared by the focused ion beam technique (FIB). A TEM/STEM FEI Tecnai F30 microscope working at an accelerating voltage of 300 kV and equipped with a field emission gun and a Li EDX spectrometer was used.

The crystallinity of the layers has been studied by X-ray diffraction analysis. The measurements were performed on a PANa-lytical X'Pert MRD PRO using Cu Kα-radiation in the ω/2θ mode. The ICDD-data base (PDF-2, International Centre for Diffraction Data, 12 Campus Boulevard, Newtown Square, Pa. 19073) was used to identify the crystallographic phases being present in the coatings. In the ω/2θ scans, the peaks from the substrate (WC) are dominating with respect to the layer peaks. In order to obtain more information for the deposited functional layer and interface, the XRD measurements have been additionally performed at a grazing incident angle of 1°.

High resolution XRD has been used to determine stresses in the deposited layers. The curvature of the Si(001) substrate wafer has been determined by the "travelling peak" technique which consists on the measurement of Rocking Curves (RC's, Si(004) reflection) at different positions on the sample. The curvature radius was used to calculate the stress based on the Stoney (G. Stoney, Proc. R. Soc. London, Ser. A 82, 172 (1909)) equation. The resulting stress value combines extrinsic and intrinsic stress. The extrinsic or thermal stress is caused by the different coefficients of thermal expansion between substrate and layer. Because it was the goal of the experiments to elucidate the influence of the different modes of operation on intrinsic stress only qualitatively, the two stress contributions are not separated in this discussion.

Figure 1B:
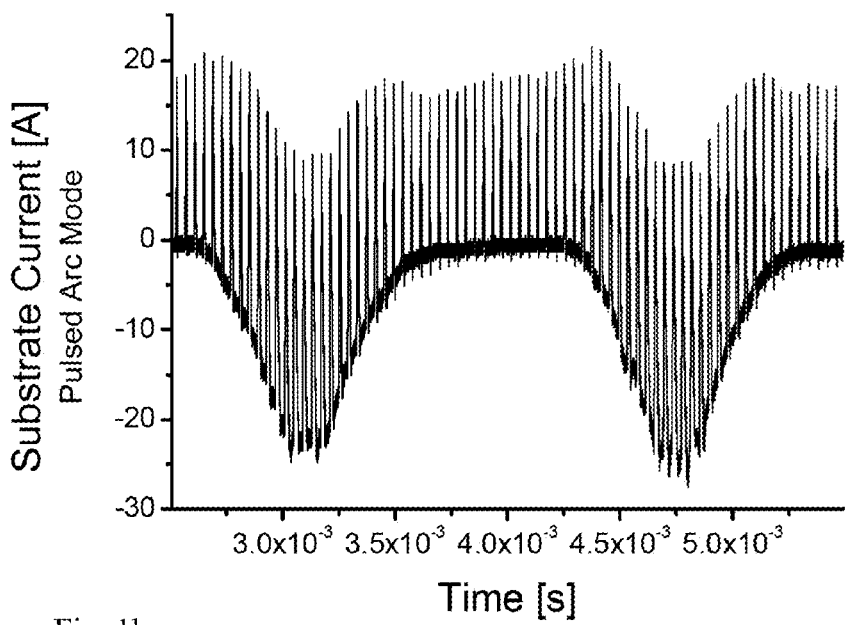
FIG. 1b shows a substrate current for the pulsed operation of the arc source (time scale different from 1a). The 25 kHz substrate bias is superposed by the pulses of the arc power supply with the frequency of 700 Hz resulting in substrate ion currents up to 28 A.

The following results were obtained:

The substrate current as a function of time is shown in FIG. 1a for the DC operation of the arc source with 200 A arc current. The time interval for "ion plating" (negative bias) is 36 µs and for 4 µs a positive potential of the same value is applied to allow for discharging of the deposited oxide by the electrons of the plasma. FIG. 1b (different time scale) displays the substrate current for the pulsed arc current. In this case a steady state (base) current of 50 A was superposed with a pulse current of 420 A at a pulse frequency of 700 Hz. The figure shows the superelevation of the ion current during the pulse and the superposition which is caused by the 25 kHz substrate bias. Values of up to 30 A ion current are measured during the pulse of the arc current. The occurring beats between bias and arc current were time averaged to avoid erroneous values in the integration of the ion currents. The time average of the ion current (negative current region) resulted in a value of 2.8 A for the DC mode. In contrast to this, the substrate ion current increased to 4.9 A for pulsed arc current with the same time average of 200 A. The value of the substrate ion current depends on the specific pulse parameter, especially the height of the superposed pulse and the steepness of the pulse, which was 106 A/s for this experiment. Despite the clear increase in the substrate ion current, no difference was measured for the evaporation rate (target mass loss per average arc current per time).

The increased ion current has been attributed in the literature mainly to an increase of the charge state of the ions (A. Anders, S. Anders, B. Jüttner, I. G. Brown, IEEE Trans. Plasma Sci. PS-21 (1993) 305; A. Anders, IEEE Trans. Plasma Sci. 26 (1998) 118; H. Fuchs, H. Mecke, M. Ellrodt, Surf. Coat. Technol. 98 (1998) 839). To verify if this is also the case for our pulse parameters, the arc sources were operated in DC as well as pulsed mode but in pure metal vapour, i.e. without working or reactive gas. This results in a working pressure of approximately $5 \times 10^{-5}$ mbar which is about two orders of magnitudes lower than during oxide synthesis. For both arc modes identical substrate ion currents were obtained. Based on this finding, it is believed that the increased substrate ion current in the experiments discussed here is mostly due to an additional ionization of the oxygen reactive gas.

For completeness, it was tested if the addition of argon to the oxygen reactive gas results in an increase of the substrate ion current. This was not the case. It therefore can be concluded that pulsing of the arc discharge is to date the only known route to increase the substrate ion current for arc discharges in oxygen reactive gas.

The influence of the different arc current modes (pulsed or DC) on layer growth was investigated next for the samples prepared according to Table 1. It is well established that the increase in the bias voltage will alter the intrinsic layer stress. This is, however, not investigated in these experiments for which by intention a low bias voltage of constantly −60 V was chosen. This bias voltage was kept constant for all the experiments.

Only one powder-metallurgical target (1, FIG. 5) was utilized for the deposition of the functional oxide layer with a nominal composition of 70 at % Al and 30 at % Cr. Also only one substrate-tree (4) was utilized in the deposition process, and the substrates were mounted on this tree at the height of the arc source. The substrates experience two-fold rotation: a slower rotation from the substrate table (2) and the additional rotation with higher frequency from the single substrate-tree (4).

Figure 2A:
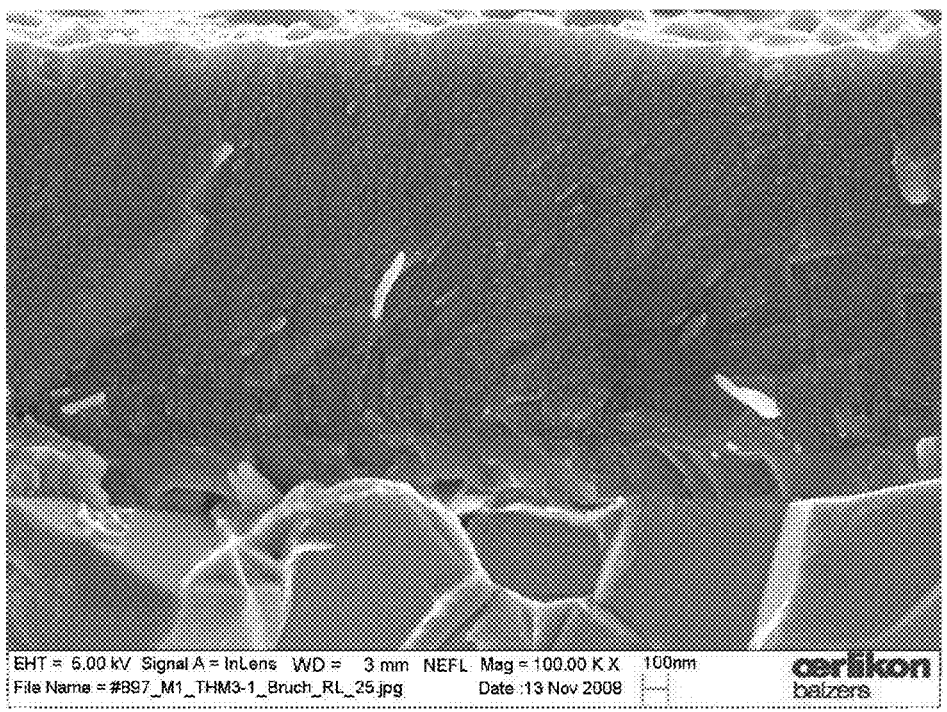
FIG. 2a shows the cross section SEM (X-SEM) micrograph of sample A prepared utilizing DC operation of the arc sources with an oxygen flow of 400 sccm showing a dense morphology.
Figure 2B:
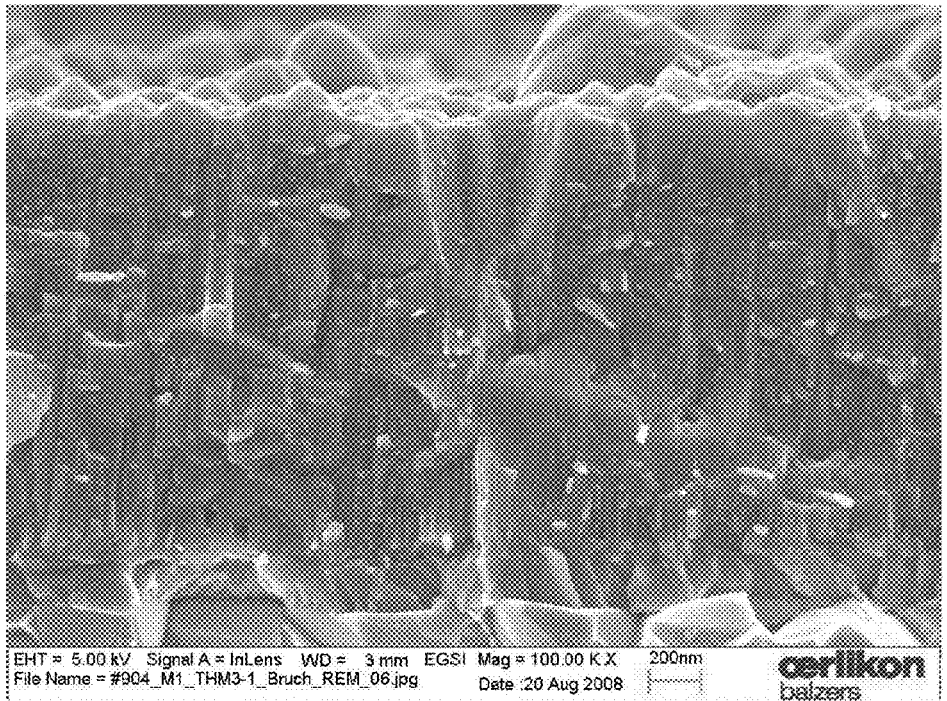
FIG. 2b shows an X-SEM micrograph of sample C prepared utilizing DC operation of the arc sources, but with an oxygen flow of 600 sccm resulting in a coarser morphology of the oxide layer.
Figure 2C:
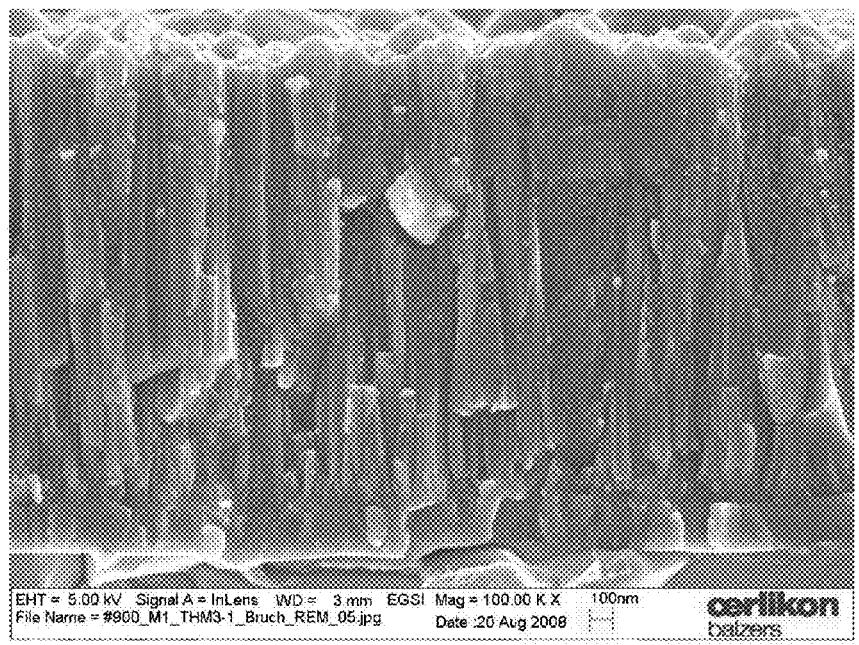
FIG. 2c shows an X-SEM micrograph of sample D prepared utilizing pulsed operation of the arc sources, again with an oxygen flow of 600 sccm exhibiting columnar morphology.

The layer morphology obtained from the X-SEM micrographs was compared first. No significant differences could be found between sample A (FIG. 2a) prepared in the DC mode and sample B (not shown) of the pulsed mode at this magnification. However, a distinctive difference in the morphology is visible if sample A is compared with sample C (FIG. 2b) which was fabricated in the DC mode, but at the higher oxygen flow of 600 sccm. While the layers deposited with 400 sccm show rather dense and structure-less morphology in the cross-section, larger crystallites of oxides are formed at higher oxygen flow with a slight tendency of columnar growth. This tendency seems stronger for sample D which was prepared with pulsed arc current (FIG. 2c).

The stress of the samples was measured next. For sample A and B the Bragg peaks in the XRD spectrum are or not sharp enough to allow for an estimation of the stress. Low tensile stress of about (250±50) MPa was measured for sample C and D. It should be recalled that according to our experience from other experiments the oxygen flow influences a number of deposition parameters, especially for flows below 400 sccm. First, the evaporation rate is increased by decreasing the oxygen flow. Simultaneously with the reduction of oxygen flow, the substrate ion current is increasing. Both effects result in the formation of an amorphous morphology accompanied with a reduction in the crystallite size. However, there is no influence on layer composition for the surface-near coating region (see RBS results below) and this raises the question (which is addressed below) if there are differences in the interface formation. For the substrate bias of −60 V, the increased substrate current stemming from the pulsed arc sources has, as expected, no significant influence on the stresses of the oxide layers and contributes to reactive gas activation only (sample C and D).

However, increasing the substrate bias (more negatively values) results in the formation of compressive stress. The value of the compressive stress depends also strongly on the oxygen gas pressure during deposition. Both facts were verified in additional experiments.

The thickness of sample B was measured to be 2.5 µm which is much thicker than for sample A (1.8 µm). Because there was no difference between the evaporation rate of the DC and the pulsed mode, it was concluded that the evaporation characteristics are different for these modes resulting in different thickness distributions at the substrate site. It could be confirmed that the thickness distributions of the pulsed arc source has a more directional evaporation characteristics: more material is evaporated into a smaller solid angle perpendicular to target surface. It results in higher deposition rates at the same height of the source (i.e. perpendicular to the target surface) but in a steeper decay of the deposition rate at other angles if it is compared with the DC thickness distribution. This explains the differences in the thickness of the samples A and B. The degree of directionality of the evaporation characteristics can be influenced by the pulse parameter, especially by the difference between base and pulse current and the steepness of the pulse and is therefore mainly determined by the properties of the arc current power supply. This finding can be explained by the plasma column contraction generated by the intrinsic magnetic field described in (E. A. Zverev, I. A. Krinberg, Technical Physics Letters, 26(4) (2000) 288).

The stoichiometry of the layers was determined by RBS. From the measured spectrum (not shown) it was concluded that the layer composition was uniform in the surface-near coating region to a depth of about 500 nm. For sample A the composition of (Al1.35Cr0.65)O3.00 was determined, for sample B (Al1.37Cr0.63)O3.00, for sample C (Al1.38Cr0.62)O3.00, and for sample D (Al1.43Cr0.57)O3.00, respectively. Based on the estimated measurement error of 5%, DC as well as pulsed operation of the arc sources results in layer compositions which are similar to the composition of the utilized target.

Figure 3A:
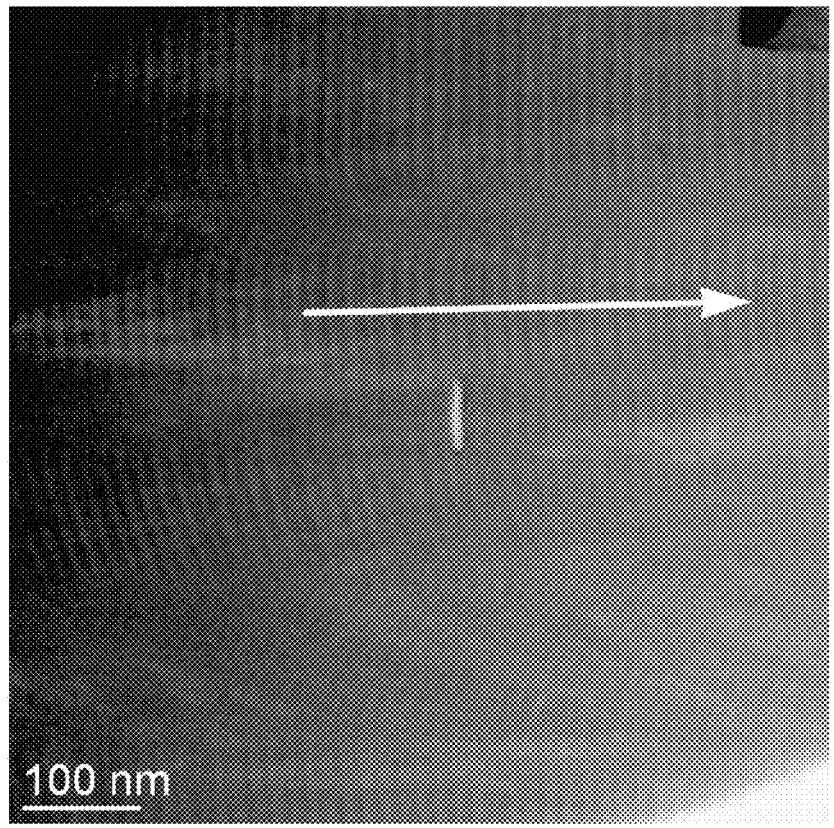
FIG. 3a shows the cross-section micrographs obtained by TEM for sample A. The pictures shows a multi-layer structure with overlapping grain growth (the growth directions is indicated by the arrow).

The cross-section micrographs obtained by TEM for sample A and B are shown in FIGS. 3a and b (wherein the white bar is contamination from previous line scan), respectively. Surprisingly, a distinctive multi layer structure is visible in both cross-sections. The number of the bilayers is for both samples the same and identical with the number of the rotations of the substrate table (2) in FIG. 5. The multilayer structure seems more pronounced for sample B, however, it has to be considered that this could be due to the larger bilayer thickness.

Figure 4:
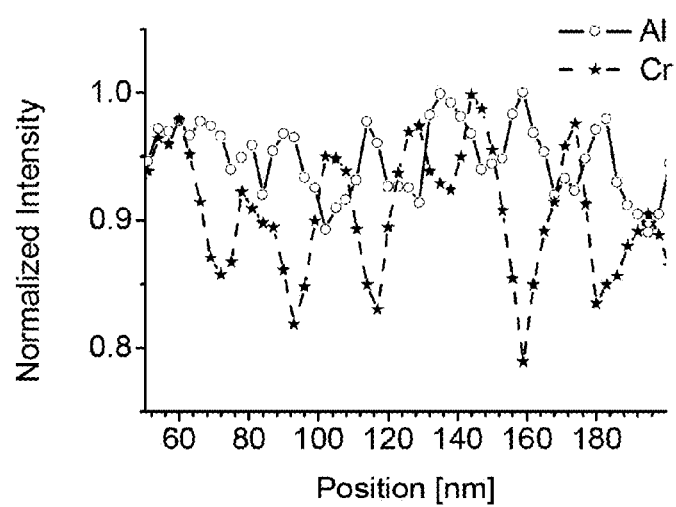
FIG. 4 shows an EDX compositional analysis of sample B for the region indicated by the arrow in the figure. The depth profile shows fluctuations of the Al and Cr concentrations in opposite directions.

To understand what causes the multi-layer structure, an EDX compositional analysis was performed for the samples in the region indicated by the arrows. The resulting EDX depth profile of sample B is displayed in FIG. 4. It indicates an alternating composition in the layer of the target constituents Al and Cr with opposite directions to each other. This means that the ratio of the constituents of the utilized target is responsible for the multi-layer formation.

Recalling the fact that only one Al—Cr source was utilized for deposition, the question for the origin of the multi layer structure is raised. The moderate substrate bias of −60 V and the abandonment of any argon gas during oxide deposition make position dependent substrate sputtering very unlikely. A distance-dependent reactivity of the oxygen (and the target components) could, however, not be excluded. In addition, there were also speculations about different evaporation characteristics of the target constituents.

Figure 5:
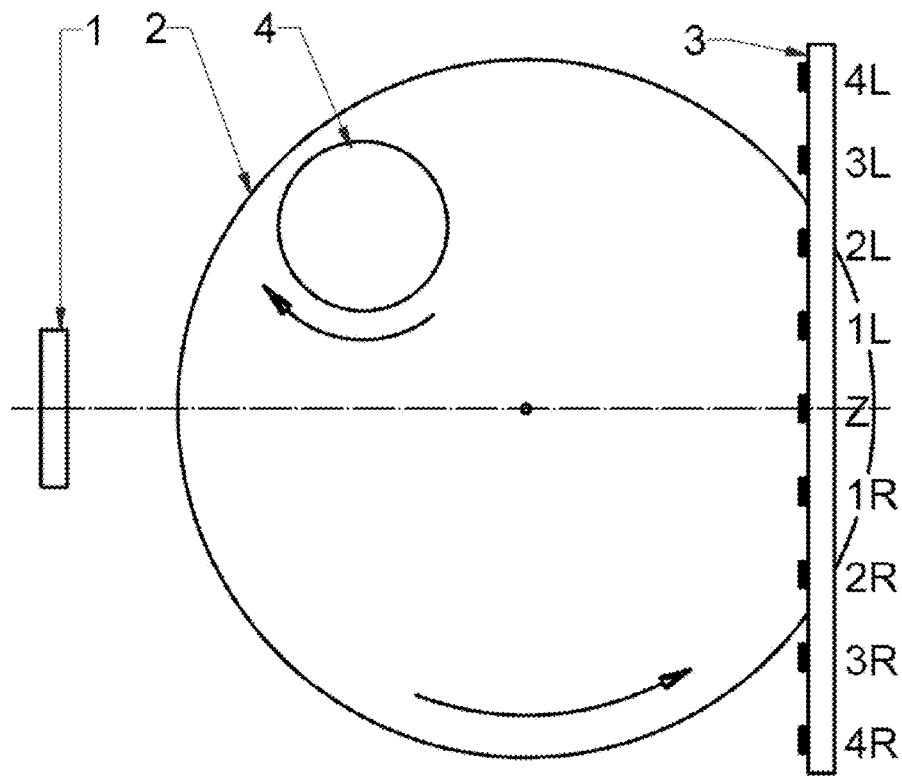
FIG. 5 is a sketch of the deposition geometry for lateral equidistant arranged samples at fixed positions in the deposition chamber to investigate the Al/Cr ratio (view from top).

To elucidate the reasons for the multi layer structure, a deposition was performed without substrate rotation onto lateral equidistant arranged samples. The arrangement is illustrated in FIG. 5 (top view). Silicon samples were coated utilizing the deposition parameters of sample A (DC arc current). The compositions of these samples were determined by RBS and the ratio of Al/Cr is displayed in FIG. 6. The obtained curve shows no symmetry with respect to position Z (substrate at central position at the symmetry axis with target) but a steady increase of Al/Cr from left (L) to right (R). The asymmetry is a strong indication that neither the evaporation characteristics nor reactivity aspects can explain the fluctuations in the multi layer.

It has to be mentioned that the place of the anode for the arc discharge is not positioned at the symmetry axis perpendicular to the target centre and its surface. Therefore, there is no straight arc discharge created. Instead the discharge has a curvilinear characteristic on its way from the cathode to the anode.

Figure 6:
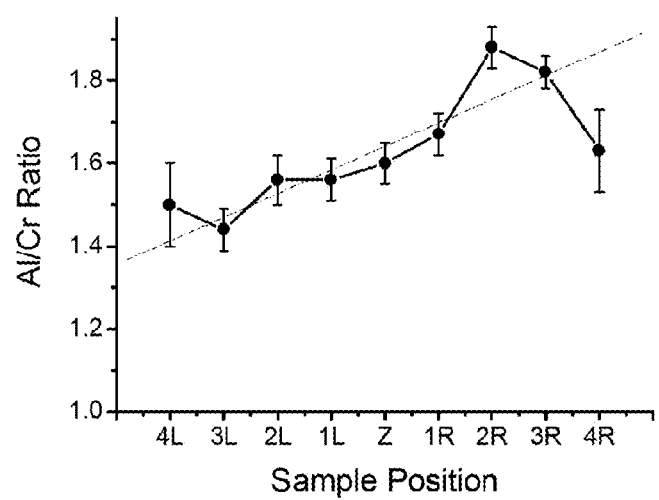
FIG. 6 shows the Al/Cr ratio determined by RBS in function of the lateral distribution of the samples depicted in FIG. 5. There is no symmetry with respect to position Z (substrate at central position at the symmetry axis with target), but a steady increase of Al/Cr from left to right.

This is the base for the explanation of the position-dependent Al/Cr distribution displayed in FIG. 6 and gives the explanation for the different ratios of the Al/Cr at different positions in the deposition chamber. The constituents of the target are vaporized during arc operation and partially ionized in the arc. The curvilinear transport of the ionized Al and Cr vapours in the discharge is the reason for the partial splitting of the materials. According to the different masses of the two ionized target constituents, the ionized vapour is splitted according to the different mass and charge state of the ionized vapour. And this establishes a gradient of concentration in the deposition system. During rotation, the substrates are exposed to different position-dependent Al/Cr concentrations and a multi-layer structure is created.

The separation of the target constituents in the curvilinear arc discharge is of course only a partial one. One reason is that the neutral vapour or droplets are not separated at all. The other reason is that the charge state of the vaporized target constituents depends on the material and the value of the arc current and may also depend (if other pulse parameter are chosen) from the shape of the pulse current. The separation will also depend on the radius and length of the arc discharge. However, if these process parameters are fixed, the multi-layer generation was proven to be reproducible.

Figure 10:
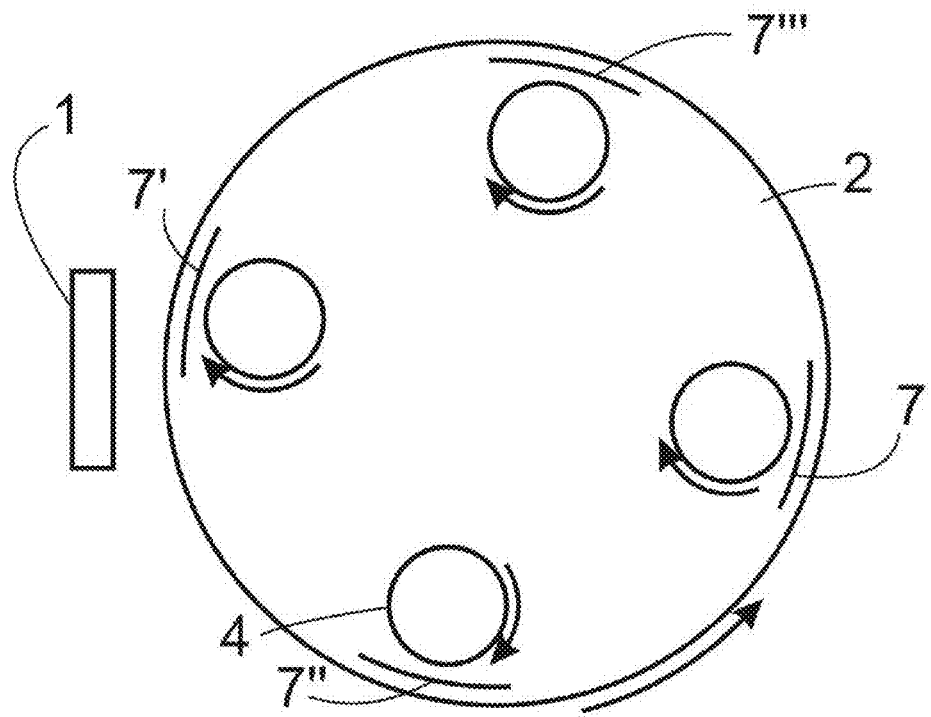
FIG. 10 shows a set-up for a shielding which can be used to influence the concentration gradient within the multi-layer coating. The shieldings can be fixed to the rotating table and prevent the substrates to be coated when the substrate-trees are passing the target. By this it is possible to realize sharper concentration changes as the substrates are not coated when they pass the target. By this a so called concentration saw tooth profile coating may be realized.

The profile of the concentration gradient within the multi-layer coating may be in addition influenced by using a shielding fixed to the rotating table and preventing the substrates to be coated when the substrate-trees are passing the target. By this it is possible to realize sharper concentration changes because the substrates are not coated when they pass the target. By this a so called concentration saw tooth profile coating may be realized. FIG. 10 shows such a setup with four substrate trees mounted to the table as well as the shieldings.

Adding even more substrate-trees to the chamber is possible and this method can be implemented in batch-type production systems.

In summary, two prerequisites have to be fulfilled to create the multi-layer: a curvilinear arc discharge and a target consisting out of minimal two constituents.

The resulting "ion splitting" occurs not only in lateral (horizontal) direction, but also vertically provided that there exists also an asymmetry in the discharge. This means that the place of the anode of the discharge can be asymmetric in horizontal as well as in vertical direction and of course also in both directions.

The rotation of the substrate is not a prerequisite for the multi-layer generation. It can also be produced at fixed substrates assuming that the place of the anode for the discharge can be changed during deposition, i.e. by the utilizing of alternating anodes placed at different locations in the deposition chamber.

The finding shows a method to form multi layer-structures based on slight variations in the stoichiometry if composite targets are used in the deposition process and if an asymmetry in the discharge current is established.

The nice thing is that the multi-layer is formed essentially in the same material system which is determined by the target constituents. In the simplest form this results in a multi-layer which consists only out of the target material. However, for many applications one or more reactive gases will be added during arc evaporation which will react with the target material to form the layer. These gases can be nitrogen, hydrocarbons, silan, hydrogen and all other gases necessary for the layer synthesis and also mixtures of these gases.

Especially preferred is oxygen as reactive gas to synthesize oxide layers. It is known from previous patent applications of the inventor (WO 2006/099754, WO 2008/043606) that the oxides may have amorphous structure or may be synthesized in a defined crystal structure, e.g. in corundum-type structure of the Al—Cr—O solid solution.

Figure 9:
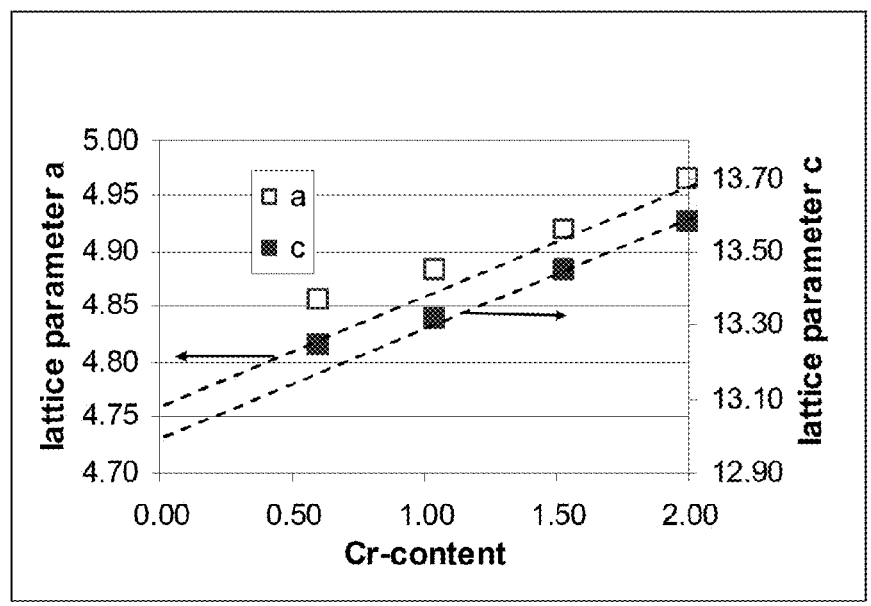
FIG. 9 shows the variation of the lattice constant a and c for the $(Al,Cr)_2O_3$ solid solution in function of the Cr content.

In the latter case the multi-layer (or the variation of the concentration versus depth) produces a variation of the lattice constant during growth if the deposited layer growths in the same crystal lattice only (FIG. 9, for Al—Cr—O system). If this variation is small enough or if the thickness is below a critical thickness for relaxation, this results in strained layer growth of oxides which can be partially epitaxial, e.g. with respect to larger crystal grains. In other words, for the discussed experiments it results in the strained layer (partially epitaxial) growth in the corundum-type structure of the Al—Cr—O solid solution.

The disclosed facts elucidate a simple method to generate and control the intrinsic layer stress based on the generation of strained multi-layers. The procedure could assist standard methods (A. E. Santana, A. Karimi, V. H. Derflinger, A. Schütze, Surf. Coat. Technol. 163-164 (2003) 260) to generate multi-layer structures which utilize different target materials in combination with substrate rotation, however, do not need different target material for the multi-layer generation. The necessary requirements are composite targets and a curvilinear arc discharge resulting in a splitting of the ionized vapour of the target constituents in the discharge.

Figure 3B:
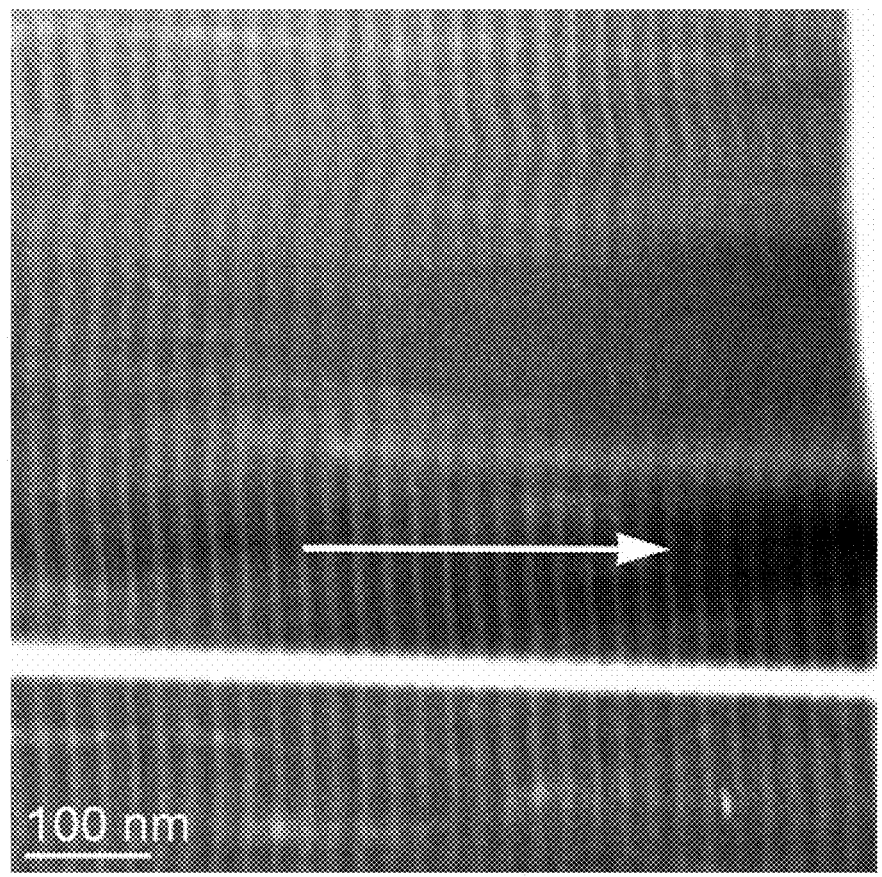
FIG. 3b shows the cross-section micrographs obtained by TEM for sample B. The multi-layer consists of thicker bilayers with seemingly reduced grain growth (white bar in the picture is contamination from a previous line scan).
Figure 7:
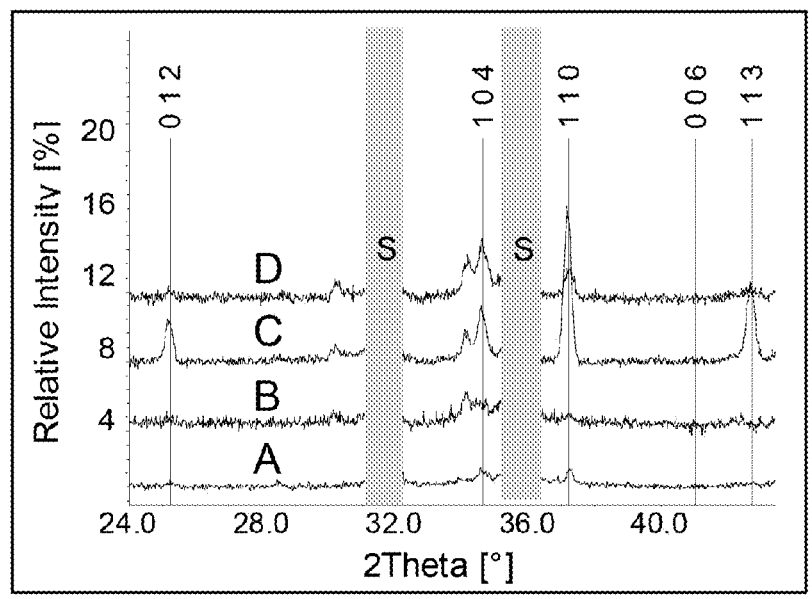
FIG. 7 shows XRD patterns of A, B, C and D. The 2θ scans were performed at a grazing incident angle of 1°. The areas designated by S cover the peaks from the substrate.
Figure 8A:
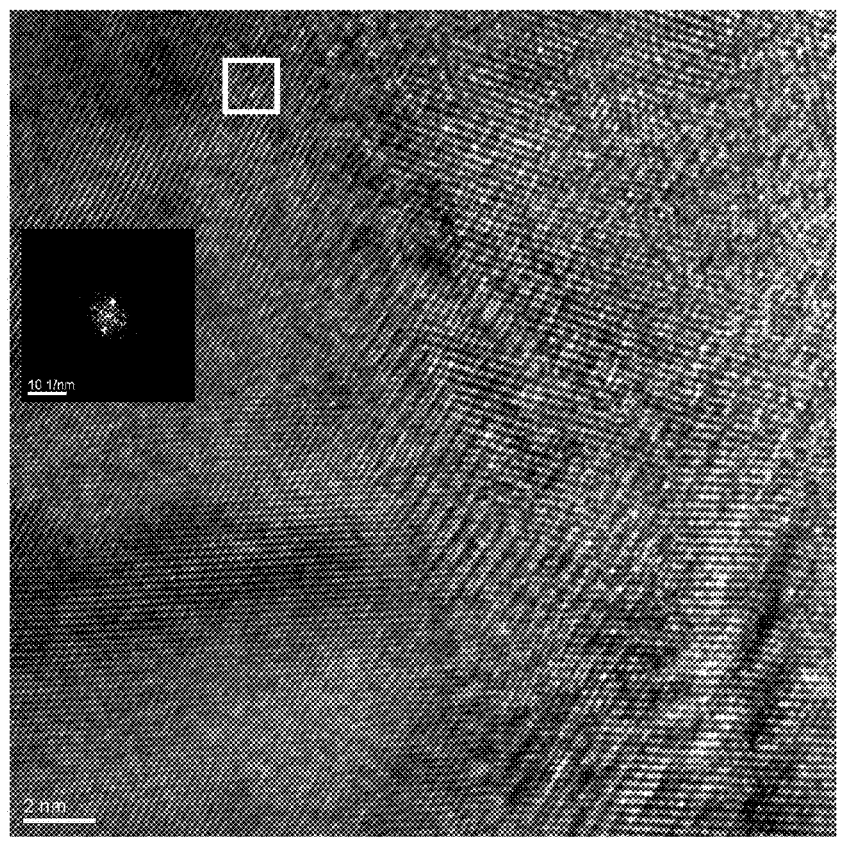
FIG. 8a shows high resolution X-TEM micrograph for the interface near region of sample A is shown with the inserted Fourier transform of the intensity pattern of the framed region. No clear assignment to a crystal structure and a material could be made for this pattern.
Figure 8B:
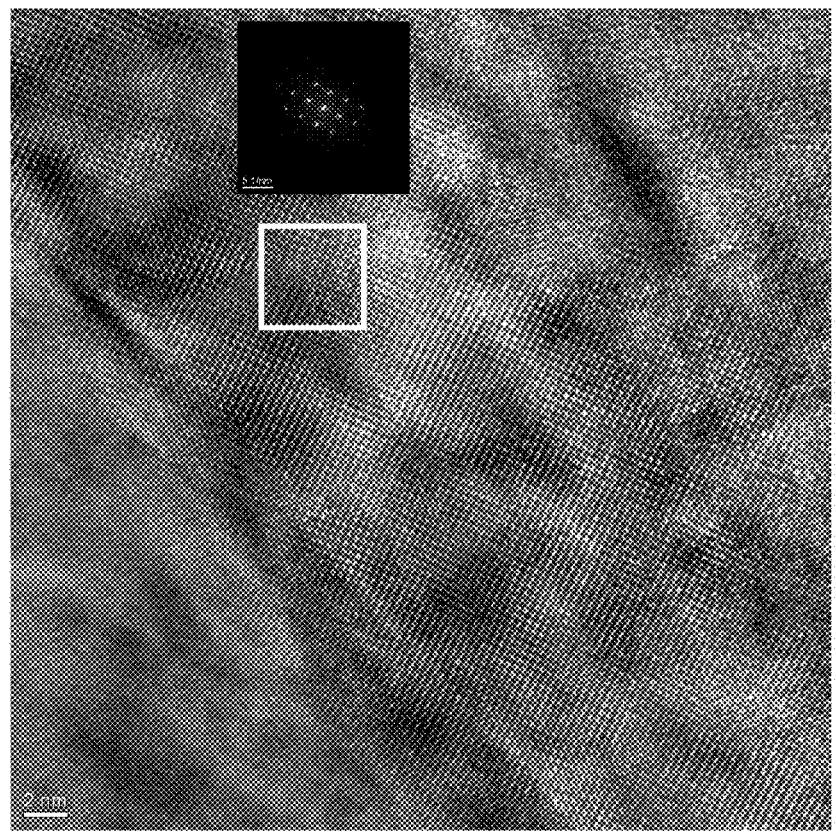
FIG. 8b shows the interface of sample B obtained by pulsed operation of the arc sources was investigated by X-TEM. The pattern obtained after Fourier transformation can be fitted with the corundum structure.

Samples A and B show lower crystallinity in the corundum phase than samples C and D (XRD spectra in FIG. 7). The crystallite size for samples C and D was estimated to be about 20 nm while the crystallite size in samples A and B is significantly smaller which can be seen in the very broad reflections and which is also supported by the comparison of the layer morphology between A and C (FIGS. 2a and 2b). The X-TEM pictures (FIGS. 3a and 3b) show alternating layers related to a variation of the Al/Cr contents in the corundum phase. The thickness of these layers is in the range of 10 nm to 15 nm. The crystal growth seems to be suppressed by this fluctuation in the Al/Cr contents explaining the much broader diffraction peaks for A and B (FIG. 7). The suppressed corundum phase formation could be also the result of the lower oxygen flow. The higher oxygen flow of 600 sccm supports the crystal growth and results in much higher crystallinity of the corundum phase which can be seen for samples C and D. This growth also shows a distinctive difference in the texture for C and D.

Based on these findings, the generation of these ("intrinsic") multi-layers can be used to support fine crystalline growth down to nanometer or atomic scale, namely via controlling the thickness of the bilayers. It is therefore a tool to control crystallite sizes and influence the mechanical properties like hardness and toughness.

On the other hand, it can generate intrinsic stress in single crystallite growth by altering the strain energy of the coating, i.e. by variation of the layer stoichiometry in small layer dimensions.

Based on the results the following conclusions can be drawn.

Pulsing of the arc sources is to date the only method to compensate for the strong reduction of the substrate ion current in deposition processes with pure oxygen reactive gas. The pulsed arc currents result primarily in the excitation of the oxygen reactive gas for the process parameters discussed here.

Pulsing alters the evaporation characteristics drastically. In accordance with the literature (E. A. Zverev, I. A. Krinberg, Technical Physics Letters, 26(4) (2000) 288), it is believed that the increase of the intrinsic magnetic field is responsible for stronger focusing of the arc discharge. This is reflected in the thickness distribution in vertical as well as horizontal direction. More material is deposited under smaller solid angles in directions perpendicular to the target surface. This effect may be utilized to control and smooth the thickness distribution. It may also be used to amplify (in combination with the increased intrinsic magnetic field) the splitting of the target constituents in curvilinear discharges. The fact that there is no influence on the evaporation rate seems consistent with the picture that pulsing in these experiments affects the reactive gas only.

The higher substrate ion current from pulsing has little or no influence on the layer morphology at low (−60V) bias, but promotes compressive stress at higher (−100 V).

The influence of the oxygen is much more pronounced and higher oxygen flow changes morphology to larger crystallites with partially columnar growth. This suggests that already at low arc current the oxygen is sufficiently reactive at substrate site. This is also supported by the RBS results which do not show differences in the stoichiometry, neither in the case of pulsing nor in the case of higher oxygen flow.

Unexpected was the formation of multi-layers which originate from the separation of the ions of the target constituents in a curvilinear arc discharge which results in slight deviations from average stoichiometry.

This is a method to control the intrinsic stress in layers which are deposited utilizing alloy targets to generate strained layer epitaxial growth in an amazing simple approach. A curvilinear discharge for arc evaporation can easily be realized in batch-type systems and hence may be implemented in production systems. The consequence of such a possibility on mechanical and also electrical transport properties in oxides and other materials is of great potential.

Some possibilities were found to influence the intrinsic stress in ternary oxide materials synthesized by (pulsed) arc evaporation. Most of them can readily be implemented in production systems.

Advantages of the Invention

1. The invention shows a method to increase the substrate ion current in arc evaporation processes utilizing pure oxygen reactive gas by pulsing of the arc sources. It teaches the utilization of the increased substrate ion current to influence the intrinsic stress of the oxide coatings.
2. The invention discloses a method to form multi-layer coatings within one material system for which the metallic or semi metallic constituents of the coating are defined by the constituents of the composite target which is utilized for arc evaporation.
3. The invention teaches a method to separate the constituents of composite targets in an asymmetric arc discharge with the help of an anode which is not positioned in the symmetry axis perpendicular to the target surface.
4. The multi-layer originates from variations in the stoichiometry of the metallic and or semi metallic constituents of the target utilized for the cathodic arc evaporation.

5. The variation in the stoichiometry which causes the multi-layer structure may result in a variation of the composition of the formed compounds in the layer, it may also result in the variation of the lattice constant for the case that only one compound is synthesized.
6. Therefore, a method is disclosed which allows the realization of small lattice constant variations utilizing the variations in the stoichiometry of the constituents of the target arising from the ion splitting in the curvilinear (asymmetric) arc discharge.
7. Additionally, a method is disclosed which uses the pulsing of the arc discharge to vary the degree of ion splitting in the discharge for the formation of multi-layers at standing as well as rotating substrate.
8. Finally, a method is disclosed in which the place of the anode for the arc discharge is alternated to create different ion splitting which results in multi-layers at fixed substrates.

Differences to Prior Art

The invention is related to two different methods of influencing the intrinsic stress in (1) oxide layers synthesized by cathodic arc evaporation and in (2) layers consisting of two or more than two elements evaporated from a composite target, also in cathodic arc evaporation processes.
(1) It was realized that the utilization of oxygen as reactive gas in the cathodic arc evaporation results in a distinctive drop of the substrate ion current if one compares with arc evaporation of metals and the synthesis of metal nitrides under similar process conditions (arc current, gas pressure, bias voltage). The reason for this is not understood. Knowing that the substrate ion current (in combination with the substrate bias) has strong influence on condensation energy and the formation of intrinsic stress (A. Anders, Cathodic Arcs, Springer, 2008), the increase of the substrate ion current is essential for the control of the stress in the deposited layers. It is especially important for oxide coatings. These coatings tend to have tensile stress. Some applications (e.g. wear protective coatings for cutting tools utilized in interrupted cutting processes) require coatings exhibiting compressive stress to prevent cracking. Routes to increase the substrate ion current are therefore inevitable. It was found that the operation of the arc sources with pulsed current increases drastically the substrate ion current. The method is important, because neither the addition of argon nor the increase of substrate bias alone did alter the substrate ion current. Also, no increase of the ion charge state like it is described in literature could be obtained under the chosen conditions.
(2) The second method discloses a procedure to synthesize multi-layer structures based on splitting of the ions with different masses (elements) in a curvilinear cathodic arc discharge. The source of the ionized vapour is a composite target consisting out of two or more constituents which is vaporized in this cathodic arc discharge. The ion splitting results in variations for the ratio of the different masses (elements) at different positions in the deposition chamber. Either a substrate rotation or a variation in the place of the anode (which varies the way of the curvilinear discharge) in the case of fixed substrates generate the multi-layer at the substrate. Therefore, this multi-layer formation is distinguished from other methods of multi-layer generation which are based either on alternating deposition of different materials or on the alternating incorporation of an additional material (element) to the deposition.

A method to increase the substrate ion current in cathodic arc evaporation for the deposition of oxide coatings was discussed characterized in that the arc sources are operated with pulsed arc currents.

A method was disclosed to generate position dependent (time invariable) variations in the ratio of the constituents of composite target utilizing ion splitting. Preferably this method is combined with substrate rotation.

A method to generate time dependent variations in the ratio of the constituents of composite target utilizing ion splitting by altering the anode position of the arc discharge was disclosed. Preferably this method is combined with a fixed substrate position.

A method to generate multi-layer coatings characterized in that a composite target of two or more constituents is utilized for the arc evaporation was disclosed. Thereby a curvilinear arc discharge is established characterized in that that a position dependent variation of the ratio of the target constituents is established.

A multi-layer coating was disclosed synthesized by cathodic arc evaporation exhibiting essentially the materials based on the constituents of the composite target for cathodic arc evaporation and additional reactive gas additions, whereby the multi-layer is generated by a variation of the stoichiometry of the target constituents present in the composite target.

This multilayer coating is preferably based on oxides. It is preferably a binary or ternary coating system.

A multi-layer coating was disclosed which exhibits over the multi-layer essentially the same crystal structure characterized that the variation on stoichiometry results in variation of the lattice constant of this same crystal structure. As discussed, such a multilayer system may result in variation of the material concentrations of the mixture of the compounds.

The method to generate the multi-layer uses the target constituents, not with other materials, and does not depend on gas switching. By generating strained multi-layer coatings the strain alters optical and electronic properties. In effect, this can be used to reproducible alter optical and or electronical properties.

With the help of the method as disclosed strained multi-layer epitaxial growth may be generated in one material system by variation of the stoichiometry of the target constituents.

A new method to synthesize strained multi-layers is disclosed which is based on induced deposition-variations in the concentrations of the metallic or semi metallic layer components which are present in a composite target utilized for the arc evaporation.

The multi-layers are generated by a variation in the ratio of the materials (elements) of the same material system which is present in the composite target.

A unique feature of the method is the generation of strained super-lattices regions in the coating, i.e. the realization of the multi-layer structure in the same crystal lattice by altering the lattice constants simultaneously with the altering the concentrations of target constituents present in the layer.

The strained layer growth obtained by this method may be used to influence the material properties (e.g. electrical, optical) by the engineering of the lattice strain.

The method can be utilized in PVD production systems to synthesize multi-layers in nano-size dimensions.

Although this method can be used for all materials which can be synthesized from binary (and higher) composite targets, it is especially suited and advantageously for the synthesis of oxide multi-layers.

Here, especially the application of the multi-layers for coatings which improve the performance of cutting and forming tools is described.

The invention pertains to a method for the production of coatings by physical vapor deposition (PVD), wherein a binary target or a target with more than two constituents is evaporated in a curvilinear cathodic arc discharge, causing the ions with different masses (elements) to be splitted and the ion splitting results in variations for the ratio of the different masses (elements) at different positions in the deposition chamber.

Further, the invention applies to a method that is characterized by a multilayer coating achieved either by substrate rotation or a variation in the place of the anode, which varies the way of the curvilinear discharge.

The invention also relates to a method that is characterized in such a way that the anode is positioned outside the symmetry axis perpendicular to the target surface.

Another method according to the invention is characterized in that for the generation of the multilayer the substrate is rotated or the substrate is fixed and the place of the anode for the discharge is changed during deposition.

Furthermore, the invention pertains to a method that is characterized by the place of the anode for the discharge being changed by utilizing of alternating anodes placed at different locations in the deposition chamber.

The invention relates further to a method that is characterized in such a way that the substrate bias (substrate ion current) is higher than −100 V.

A further method according to the invention is characterized in that the arc sources are operated with pulsed arc currents. Further, the invention applies to a method that is characterized in that pure oxygen is used as a reactive gas.

The invention also pertains to a method that is characterized in such a way that the metallic or semi-metallic constituents of the coating are defined by the constituents of the composite target, which is utilized for the arc evaporation.

Another method according to the invention is characterized in that the target is a single composite target.

Furthermore, the invention relates to a method that is characterized in that the target is an Al—Cr target.

The invention also applies to a method that is characterized in such a way that the Al—Cr target is a target with an Al-content of about 70 at % and a Cr-content of 30 at %.

Further, the invention pertains to a method that is characterized by the profile of the concentration gradient within the multilayer coating being influenced by using a shielding fixed to the rotating table and preventing the substrates to be coated when the substrate-trees are passing the target.

Also the invention relates to a method that is characterized in that the constituents of the target are vaporized during arc operation and partially ionized in the arc, wherein the curvilinear transport of the ionized metal vapours in the discharge leads to the partial splitting of the materials according to the different masses of the two ionized target constituents, wherein the ionized vapour is splitted according to the different mass and charge state of the ionized vapour, which establishes a gradient of concentration in the deposition system.

The invention furthermore pertains to a method that is characterized in such a way that the asymmetry in the discharge occurs in the lateral (horizontal) and/or vertical direction in such a way that the anode of the discharge can be asymmetric in horizontal as well as in vertical direction or in both directions.

What is claimed is:

1. A method for production of coatings by physical vapor deposition (PVD), comprising:

evaporating a single composite target with two or more constituents in a curvilinear cathodic arc discharge that is asymmetric with respect to an axis normal to a surface of the target, causing ions with different elements to be split, resulting in variations of a ratio of the ions with different elements at different positions in a deposition chamber, wherein a multilayer coating is achieved by substrate rotation, wherein asymmetry in the curvilinear cathodic arc discharge occurs in a horizontal and/or vertical direction in such a way that the anode of the curvilinear cathodic arc discharge is asymmetric in a horizontal or in a vertical direction or in both directions, wherein the multilayer coating is generated using a single curvilinear cathodic arc discharge, and wherein at least the substrate to be coated is passed through a first area of the deposition chamber having a higher concentration of ions of a first metal from the single composite target and subsequently passed through a second area of the deposition chamber having a higher concentration of ions of a second metal from the single composite target in such a manner that the multilayer coating comprising layers having a higher concentration of ions of the first metal and layers having a higher concentration of ions of the second metal is deposited on the substrate to be coated.

2. The method according to claim 1, characterized in that the anode is positioned outside of a symmetry axis perpendicular to a target surface.

3. The method according to claim 1, characterized in that a substrate bias or a substrate ion current is higher than −100 V.

4. The method according to claim 1, characterized in that sources of the curvilinear cathodic arc discharge are operated with pulsed arc currents.

5. The method according to claim 1, characterized in that pure oxygen is used as a reactive gas.

6. The method according to claim 1, characterized in that metallic or semi-metallic constituents of a coating are defined by constituents of a composite target, which is utilized for arc evaporation.

7. The method according to claim 1, characterized in that the target is an Al—Cr target.

8. The method according to claim 6, characterized in that the target is an Al—Cr target with an Al-content of about 70% and a Cr-content of about 30%.

9. The method according to claim 1, characterized in that a profile of a concentration gradient within the multilayer coating is influenced by using a shielding fixed to a rotating table and preventing the substrate from being coated when substrate-trees are passing the target.

10. The method according to claim 6, characterized in that the constituents of the composite target are vaporized during arc operation and partially ionized in an arc, wherein a curvilinear transport of ionized metal vapours that is asymmetric with respect to an axis normal to a surface of the target in the curvilinear cathodic arc discharge leads to a partial splitting of materials according to the different elements of two ionized target constituents, wherein the ionized metal vapour is split according to the different elements and charge state of the ionized metal vapour, which establishes a gradient of concentration in a deposition system.

11. A method for production of a multilayer coating by physical vapor deposition (PVD), comprising:

splitting ions with different elements, the splitting comprising evaporating a single composite target with two or more constituents in a single curvilinear cathodic arc discharge that is asymmetric with respect to an axis normal to a surface of the target, the asymmetry in the single curvilinear cathodic arc discharge occurring in a horizontal and/or vertical direction; and varying the single curvilinear cathodic arc discharge by rotating a substrate, wherein a ratio of the ions with different elements varies at different positions in the deposition chamber, and wherein at least the substrate to be coated is passed through a first area of the deposition chamber having a higher concentration of ions of a first metal from the single composite target and subsequently passed through a second area of the deposition chamber having a higher concentration of ions of a second metal from the single composite target in such a manner that the multilayer coating comprising layers having a higher concentration of ions of the first metal and layers having a higher concentration of ions of the second metal is deposited on the substrate to be coated.

12. A method for production of a multilayer coating by physical vapor deposition (PVD), comprising:

splitting ions with different elements, the splitting comprising evaporating a single composite target with two or more constituents in a curvilinear cathodic arc discharge that is asymmetric with respect to an axis normal to a surface of the target, the asymmetry in the curvilinear cathodic arc discharge occurring in a horizontal and/or vertical direction; and varying the curvilinear cathodic arc discharge by rotating a substrate, wherein a ratio of the ions with different elements varies at different positions in the deposition chamber, wherein droplets are not separated from the curvilinear cathodic arc discharge, and wherein at least the substrate to be coated is passed through a first area of the deposition chamber having a higher concentration of ions of a first metal from the single composite target and subsequently passed through a second area of the deposition chamber having a higher concentration of ions of a second metal from the single composite target in such a manner that the multilayer coating comprising layers having a higher concentration of ions of the first metal and layers having a higher concentration of ions of the second metal is deposited on the substrate to be coated.

13. The method according to claim 1, wherein, for generating the multilayer coating, the substrate is rotated.

14. The method according to claim 11, wherein the single curvilinear cathodic arc discharge varies by rotating a substrate.

15. The method according to claim 12, wherein the curvilinear cathodic arc discharge varies by rotating the substrate.

16. The method according to claim 1, wherein a ratio of ions with different constituents varies at different positions of each of the multilayer coating.

* * * * *